United States Patent
Green et al.

(10) Patent No.: US 10,600,722 B1
(45) Date of Patent: Mar. 24, 2020

(54) HEAT SINK FOR ALTERNATOR

(71) Applicant: DENSO International America, Inc., Southfield, MI (US)

(72) Inventors: Landen Green, Farmington Hills, MI (US); Andrew Rumptz, Canton, MI (US); Ilco Aksovski, Macomb, MI (US)

(73) Assignee: DENSO International America, Inc., Southfield, MI (US)

( * ) Notice: Subject to any disclaimer, the term of this patent is extended or adjusted under 35 U.S.C. 154(b) by 0 days.

(21) Appl. No.: 16/208,820

(22) Filed: Dec. 4, 2018

(51) Int. Cl.
*H01L 23/40* (2006.01)
*H05K 7/20* (2006.01)
*H02K 11/04* (2016.01)

(52) U.S. Cl.
CPC ........ *H01L 23/4093* (2013.01); *H02K 11/046* (2013.01); *H05K 7/209* (2013.01); *H05K 7/20409* (2013.01); *H05K 7/20909* (2013.01)

(58) Field of Classification Search
CPC ......... H01L 23/4093; H01L 2023/4031; H01L 2023/4056; H02K 11/046; H05K 7/20409; H05K 7/209; H05K 7/20909
See application file for complete search history.

(56) References Cited

U.S. PATENT DOCUMENTS

| | | | |
|---|---|---|---|
| 5,040,096 A | 8/1991 | Churchill et al. | |
| 5,450,284 A * | 9/1995 | Wekell | H01L 23/4006 257/719 |
| 5,909,358 A | 6/1999 | Bradt | |
| 5,917,700 A | 6/1999 | Clemens et al. | |
| 6,075,703 A | 6/2000 | Lee | |
| 6,246,584 B1 | 6/2001 | Lee et al. | |
| 6,396,695 B1 | 5/2002 | Lee et al. | |
| 6,452,803 B1 | 9/2002 | Liu | |
| 6,944,023 B2 | 9/2005 | Bird et al. | |
| 8,646,281 B2 | 2/2014 | Lim | |
| 9,507,391 B2 | 11/2016 | Busch et al. | |
| 2004/0031586 A1 * | 2/2004 | Rearick | H01L 23/4093 165/80.2 |
| 2007/0165380 A1 | 7/2007 | Lai et al. | |
| 2008/0098750 A1 | 5/2008 | Busier | |
| 2009/0211729 A1 * | 8/2009 | Wang | H01L 23/467 165/80.3 |
| 2010/0177480 A1 * | 7/2010 | Koplow | F04D 25/0606 361/697 |
| 2013/0010428 A1 * | 1/2013 | Hayashi | H01L 23/4093 361/704 |
| 2016/0057891 A1 * | 2/2016 | Chang | H01L 23/4093 165/80.2 |

* cited by examiner

*Primary Examiner* — Jacob R Crum
(74) *Attorney, Agent, or Firm* — Harness, Dickey & Pierce, P.L.C.

(57) ABSTRACT

A heat sink assembly for an alternator. The heat sink assembly includes a clip for clipping the heat sink assembly onto a diode rectifier heat sink of the alternator. Thermally conductive material is on an inner surface of the clip. A heat sink is on an outer surface of the clip opposite to the thermally conductive material, and includes fins. Thermal energy from a hotspot of the alternator to which the heat sink assembly is clipped is conducted to the heat sink by way of the thermally conductive material and is radiated from the fins to cool the hotspot.

20 Claims, 3 Drawing Sheets

HEAT SINK FOR ALTERNATOR

FIELD

The present disclosure relates to a heat sink for an alternator.

BACKGROUND

This section provides background information related to the present disclosure, which is not necessarily prior art.

Alternators are widely used electrical generators for converting mechanical energy to electrical energy in the form of alternating current. While existing alternators are suitable for their intended use, they are subject to improvement. For example, alternators include diodes that may run hot in certain areas due to increased heat from an outside source, or higher inlet cooling temperatures. Such hot diodes and other alternator hot spots may undesirably decrease alternator performance. The present disclosure advantageously provides for an improved heat sink assembly for cooling such hot spots.

SUMMARY

This section provides a general summary of the disclosure, and is not a comprehensive disclosure of its full scope or all of its features.

The present disclosure includes a heat sink assembly for an alternator. The heat sink assembly includes a clip for clipping the heat sink assembly onto a diode rectifier heat sink of the alternator. Thermally conductive material is on an inner surface of the clip. A heat sink is on an outer surface of the clip opposite to the thermally conductive material, and includes fins. Thermal energy from a hot spot of the alternator to which the heat sink assembly is clipped is conducted to the heat sink by way of the thermally conductive material and is radiated from the fins to cool the hot spot.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of select embodiments and not all possible implementations, and are not intended to limit the scope of the present disclosure.

Corresponding reference numerals indicate corresponding parts throughout the several views of the drawings.

DETAILED DESCRIPTION

Example embodiments will now be described more fully with reference to the accompanying drawings.

Figure 1:
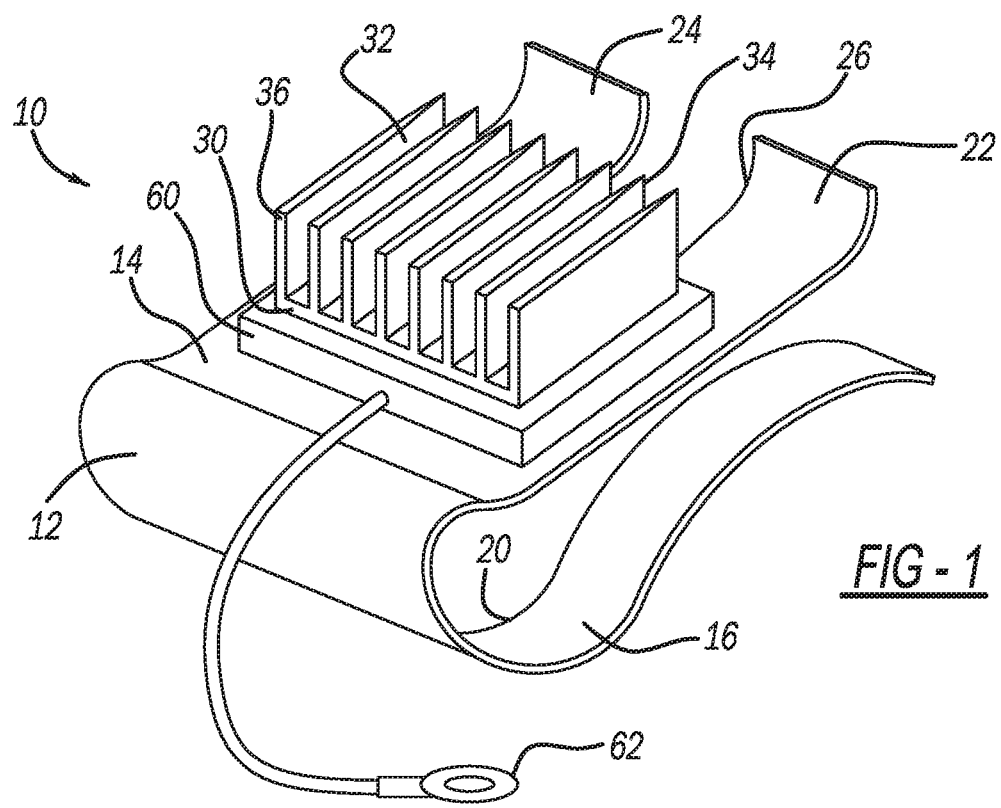
FIG. 1 is a perspective view of a heat sink assembly in accordance with the present disclosure.

FIG. 1 illustrates a heat sink assembly in accordance with the present disclosure at reference numeral 10. The heat sink assembly 10 generally includes a clip 12 having an upper surface 14, a lower first tab 16, and a lower second tab. The lower second tab is obstructed in FIG. 1 by the upper surface 14, and thus is not illustrated. However, the lower second tab is identical to the lower first tab 16, but at an opposite side of the clip 12. The lower first tab 16 and the lower second tab are spaced apart to define an opening 20 therebetween. At the upper surface 14 is an upper first tab 22, which is generally opposite to the lower first tab 16. Also at the upper surface 14 is an upper second tab 24, which is opposite to the lower second tab. An opening 26 is defined between the upper first tab 22 and the upper second tab 24.

The opening 20 is sized and shaped to accommodate a diode of a diode rectifier heat sink, such as any one of the diodes 112A, 112B, 112C of the diode rectifier heat sink 110 illustrated in FIGS. 2-5. In the examples illustrated, the clip 12 is clipped onto diode 112B, but the clip 12 may be clipped onto any other diode of the diode rectifier heat sink 110 in need of cooling (such as any one of the diodes 112A, 112B, 112C). The clip 12 may also be clipped onto or over any other hot spot of the diode rectifier heat sink 110, or of the associated alternator, in need of cooling.

Figure 2:
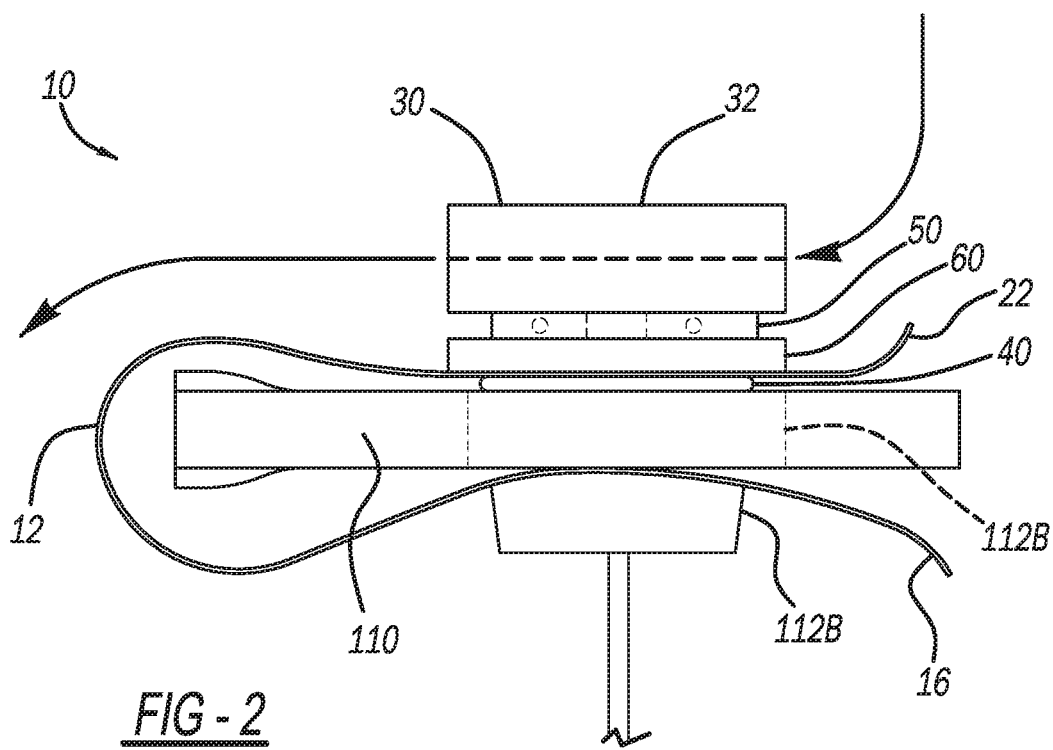
FIG. 2 is a side view of the heat sink assembly of FIG. 1.
Figure 5:
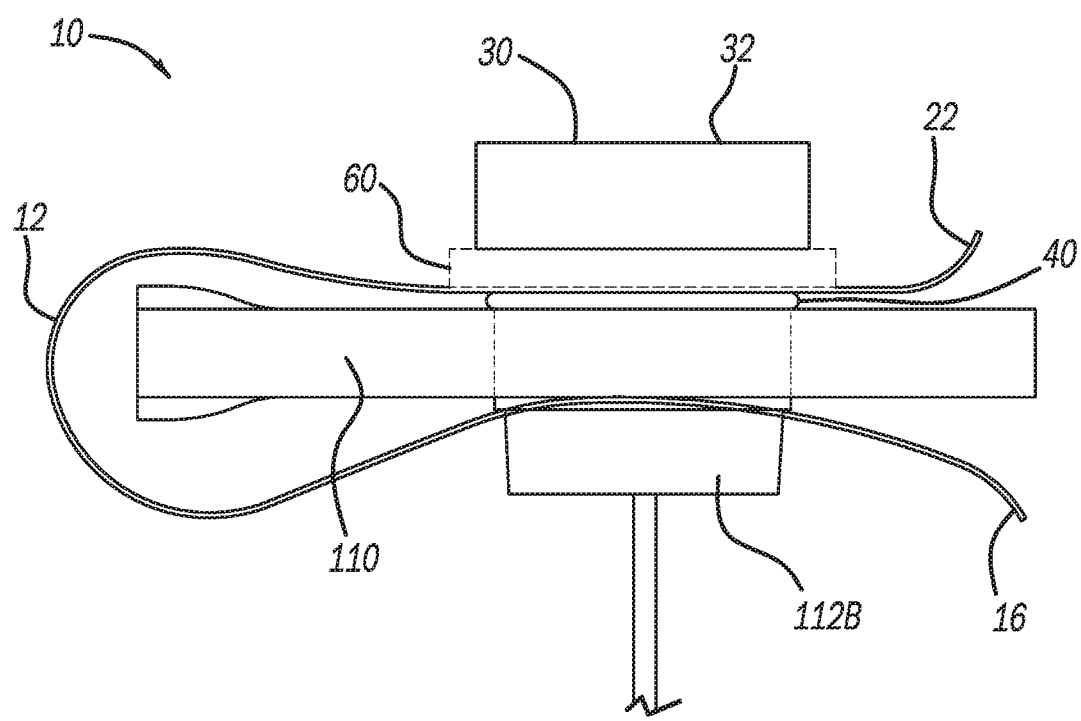
FIG. 5 illustrates another heat sink assembly in accordance with the present disclosure.

As illustrated in FIGS. 2 and 5, the heat sink assembly 10 further includes a thermally conductive material 40 on an inner surface of the upper surface 14. The thermally conductive material 40 may be any thermally conductive material suitable for conducting thermal energy away from the diode 112B (or any other diode 112A, 112C or hot spot to which the clip 12 is clipped). The thermally conductive material 40 conducts the thermal energy to the upper surface 14 of the clip 12, and ultimately to an add-on heat sink 30 of the assembly 10.

Figure 3:
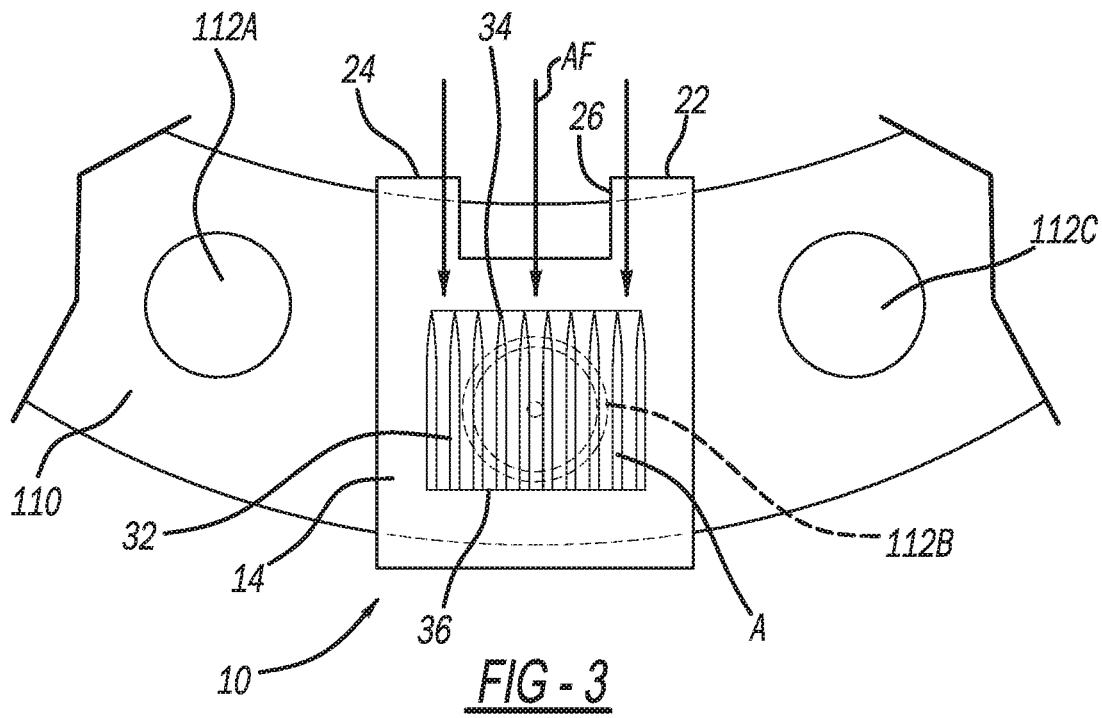
FIG. 3 illustrates the heat sink assembly of FIG. 1 clipped to a diode rectifier heat sink, and fins of the heat sink assembly at a first orientation.
Figure 4:
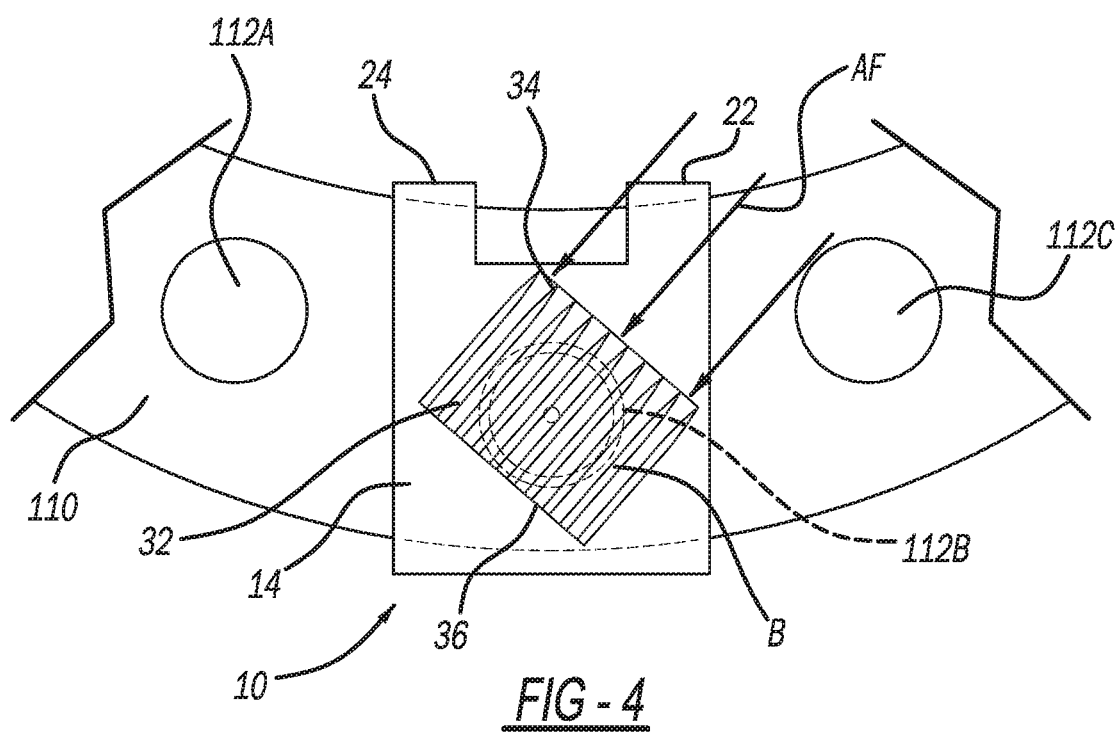
FIG. 4 illustrates the fins of the heat sink assembly at a second orientation.

The heat sink 30 includes a plurality of fins 32. The fins 32 each have a leading edge 34 and a trailing edge 36, which are at opposite ends of the fins 32. The leading edge 34 is narrower than the trailing edge 36 to facilitate airflow between the fins 32. In some applications, the heat sink assembly 10 includes a pivot mechanism 50, which is a self-adjusting pivot mechanism that allows the fins 32 to freely rotate to align the fins 32 with the direction of airflow flowing across the fins 32 in order to maximize the cooling capabilities of the heat sink 30. For example and as illustrated in FIG. 3, the pivot mechanism 50 allows the fins 32 to freely rotate to position A to align the fins 32 with airflow AF. With reference to FIG. 4, shift of airflow AF to the direction of FIG. 4 will cause the pivot mechanism 50 to self-pivot to align the fins 32 with the airflow AF in the direction of FIG. 4. The narrow leading edges 34 of the fins 32 facilitate entry of airflow between the fins 32, which facilitates rotation of the fins 32 to align the fins 32 with the direction of airflow when the assembly 10 includes the pivot mechanism 50.

The pivot mechanism 50 may be any suitable pivot mechanism that will allow the fins 32 to freely rotate to align the fins 32 with the direction of airflow AF. The pivot mechanism 50 may be arranged directly on the clip 12, or arranged between a Peltier device 60 and the heat sink 30, as illustrated in FIG. 2. In the example of FIG. 2, the Peltier device 60 is arranged directly on the clip 12. The pivot mechanism 50 is optional, and need not be included in all applications. For example and as illustrated in FIG. 5, the Peltier device 60 is mounted to the clip 12, the heat sink 30 is mounted to the Peltier device 60, and no pivot mechanism 50 is included. The Peltier device 60 is also optional.

The Peltier device 60 is any suitable thermoelectric cooling device that uses the Peltier effect to create a heat flux to facilitate the transfer of heat from the diode 1128 (or any other diode or hot spot of the diode rectifier heat sink 110 or associated alternator) to the heat sink 30. The Peltier device 60 includes a connecter 62 for connecting the Peltier device 60 to any suitable power source or ground. Suitable power sources include the alternator to which the heat sink assembly 10 is coupled to. The clip 12 has the capacity to also provide power to the Peltier device 60 by connecting to opposite polarities of the connector 62 of the Peltier device 60 (power or ground). Thus the Peltier device 60 can receive power by way of the clip 12 connected to a positive one of the diodes 112A, 1128, 112C, and the connecter 62 may be connected to any suitable ground.

The Peltier device 60 is configured to be active at a predetermined voltage that is greater than the OCV (open circuit voltage) of a fully charged battery. Furthermore, the Peltier device 60 is configured to activate when temperature of the hot spot (such as any one of diodes 112A, 1128, 112C, or any other hot spot of the alternator) is greater than a predetermined temperature. The heat sink assembly 10 may thus include electrical circuitry to sense the temperature of the diode 112A, 1128, 112C (or other hot spot) to which the heat sink assembly 10 is clipped onto.

The present disclosure thus advantageously provides for a heat sink assembly 10 including an add-on heat sink 30, as well as an optional pivot mechanism 50 and optional Peltier device 60. The heat sink assembly 10 can be clipped onto any hot spot of an alternator, such as any one of diodes 112A, 1128, 112C, in order to cool the hot spot. The alternator can be any suitable alternator for a vehicle. Exemplary vehicles include passenger vehicles, utility vehicles, recreational vehicles, mass transit vehicles, construction vehicles/equipment, military vehicles/equipment, watercraft, aircraft, etc. The present disclosure is also applicable to alternators for any suitable non-vehicular use.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

What is claimed is:

1. A heat sink assembly for an alternator comprising:
   a clip for clipping the heat sink assembly onto a diode rectifier heat sink of the alternator;
   thermally and electrically conductive material on an inner surface of the clip; and
   a heat sink on an outer surface of the clip opposite to the thermally conductive material, the heat sink including fins, thermal energy from a hot spot of the alternator to which the heat sink assembly is clipped is conducted to the heat sink by way of the thermally conductive material and the clip and is radiated from the fins to cool the hot spot.

2. The heat sink assembly of claim 1, wherein the clip is metallic.

3. The heat sink assembly of claim 1, wherein the clip includes a first tab and a second tab defining an opening therebetween, the opening sized and shaped to receive a diode of the alternator therebetween.

4. The heat sink assembly of claim 1, wherein the fins are rotatable.

5. The heat sink assembly of claim 1, further comprising a pivot mechanism that allows the fins to freely rotate.

6. The heat sink assembly of claim 5, wherein a leading edge of the fins is more narrow than a trailing edge of the fins to guide airflow between the fins and cause the fins to rotate and align with airflow passing across the heat sink assembly.

7. The heat sink assembly of claim 1, further comprising a Peltier device.

8. The heat sink assembly of claim 7, wherein the Peltier device is between the clip and the heat sink.

9. The heat sink assembly of claim 7, wherein the Peltier device is between the clip and a pivot mechanism for the heat sink, or between the pivot mechanism and the heat sink.

10. The heat sink assembly of claim 7, wherein the Peltier device is powered by the alternator.

11. The heat sink assembly of claim 10, further comprising a connector extending from the Peltier device, the connector connects the Peltier device to a power source or ground;
wherein the clip is a power-providing circuitry element that is connected to an opposite connection of the connector extending from the Peltier device; and
wherein the opposite connection defines ground as opposite to power source and power source as opposite to ground.

12. The heat sink assembly of claim 7, wherein the Peltier device is active at a predetermined voltage that is greater than the OCV (open circuit voltage) of a fully charged battery.

13. The heat sink assembly of claim 7, wherein the Peltier device is configured to be active at a predetermined voltage that is greater than a battery's OCV.

14. The heat sink assembly of claim 7, wherein the Peltier device is configured to activate when temperature of a diode of the alternator to which the heat sink assembly is clipped is greater than a predetermined temperature.

15. A heat sink assembly for an alternator comprising:
a clip for clipping the heat sink assembly over a diode of the alternator;
thermally conductive material on an inner surface of the clip;
a heat sink on an outer surface of the clip opposite to the thermally conductive material, the heat sink including fins, thermal energy from the diode of the alternator to which the heat sink assembly is clipped is conducted to the heat sink by way of the thermally conductive material and the clip and radiated from the fins to cool the diode;
a pivot mechanism that allows the fins to freely rotate to align the fins with airflow flowing across the heat sink assembly; and
a Peltier device that transfers heat from the diode of the alternator to the heat sink.

16. The heat sink assembly of claim 15, wherein the pivot mechanism is between the Peltier device and the heat sink, or between the Peltier device and the clip.

17. The heat sink assembly of claim 15, wherein the Peltier device is powered by the alternator; and
further comprising a connector extending from the Peltier device, the connector connects the Peltier device to a power source or ground.

18. The heat sink assembly of claim 15, wherein the Peltier device is configured to be active at a voltage that is greater than voltage of a fully charged battery OCV (open circuit voltage).

19. The heat sink assembly of claim 15, wherein the Peltier device is configured to be active at a voltage that is greater than a battery's OCV (open circuit voltage).

20. The heat sink assembly of claim 15, wherein the Peltier device is configured to activate when temperature of the diode of the alternator to which the clip is clipped over is greater than a predetermined temperature.

\* \* \* \* \*